(12) United States Patent
Bollen

(10) Patent No.: US 10,676,630 B2
(45) Date of Patent: *Jun. 9, 2020

(54) METALLIC NANOPARTICLE DISPERSION

(71) Applicant: AGFA-GEVAERT, Mortsel (BE)

(72) Inventor: Dirk Bollen, Mortsel (BE)

(73) Assignee: AGFA-GEVAERT, Mortsel (BE)

( * ) Notice: Subject to any disclaimer, the term of this patent is extended or adjusted under 35 U.S.C. 154(b) by 320 days.

This patent is subject to a terminal disclaimer.

(21) Appl. No.: 15/538,323

(22) PCT Filed: Dec. 10, 2015

(86) PCT No.: PCT/EP2015/079281
§ 371 (c)(1),
(2) Date: Jun. 21, 2017

(87) PCT Pub. No.: WO2016/102192
PCT Pub. Date: Jun. 30, 2016

(65) Prior Publication Data
US 2017/0349773 A1   Dec. 7, 2017

(30) Foreign Application Priority Data
Dec. 22, 2014 (EP) .................................. 14199745

(51) Int. Cl.
*C09D 11/52* (2014.01)
*B01F 17/00* (2006.01)
(Continued)

(52) U.S. Cl.
CPC .......... *C09D 11/52* (2013.01); *B01F 17/0007* (2013.01); *B22F 1/0044* (2013.01);
(Continued)

(58) Field of Classification Search
None
See application file for complete search history.

(56) References Cited

U.S. PATENT DOCUMENTS

2006/0264518 A1  11/2006 Kato et al.
2009/0142482 A1   6/2009 Li et al.
(Continued)

FOREIGN PATENT DOCUMENTS

EP   0 803 551 A2   10/1997
EP   1 666 175 A1    6/2006
(Continued)

OTHER PUBLICATIONS

Official Communication issued in International Patent Application No. PCT/EP2015/079281, dated Apr. 19, 2016.
(Continued)

*Primary Examiner* — Jenny R Wu
(74) *Attorney, Agent, or Firm* — Keating and Bennett, LLP

(57) ABSTRACT

A metallic nanoparticle dispersion includes metallic nanoparticles, a liquid carrier, and a dispersion-stabilizing compound according to Formulae I, II, III or IV,

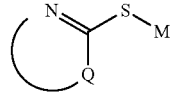

Formula I

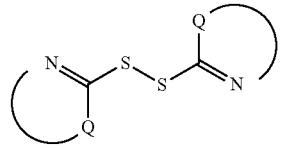

Formula II

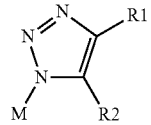

Formula III

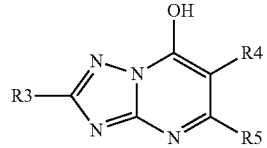

Formula IV wherein Q represents the necessary atoms to form a substituted or unsubstituted a five or six membered heteroaromatic ring; M is selected from the group consisting of a proton, a monovalent cationic group and an acyl group; R1 and R2 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thioether, an ether, an ester, an amide, an amine, a halogen, a ketone and an aldehyde, R1 and R2 may represent the necessary atoms to form a five to seven membered ring; R3 to R5 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thiol, a thioether, a sulfone, a sulfoxide, an ether, an ester, an amide, an amine, a halogen, a ketone, an aldehyde, a nitrile and a nitro group; and R4 and R5 may represent the necessary atoms to form a five to seven membered ring.

15 Claims, No Drawings

(51) Int. Cl.
| | | |
|---|---|---|
| *C09D 11/03* | (2014.01) | |
| *C09D 11/322* | (2014.01) | |
| *C09D 11/38* | (2014.01) | |
| *C09D 7/40* | (2018.01) | |
| *C09D 7/63* | (2018.01) | |
| *B22F 1/00* | (2006.01) | |
| *B22F 9/18* | (2006.01) | |
| *C09D 5/24* | (2006.01) | |
| *C09D 11/32* | (2014.01) | |
| *H05K 1/09* | (2006.01) | |

(52) U.S. Cl.
CPC .................. *B22F 9/18* (2013.01); *C09D 5/24* (2013.01); *C09D 7/63* (2018.01); *C09D 7/67* (2018.01); *C09D 11/03* (2013.01); *C09D 11/32* (2013.01); *C09D 11/322* (2013.01); *C09D 11/38* (2013.01); *H05K 1/097* (2013.01)

(56) References Cited

U.S. PATENT DOCUMENTS

| | | |
|---|---|---|
| 2009/0258202 A1 | 10/2009 | Sakaguchi et al. |
| 2009/0321689 A1 | 12/2009 | Harada et al. |
| 2010/0040846 A1 | 2/2010 | Bahnmüller et al. |
| 2010/0143591 A1 | 6/2010 | Wu et al. |
| 2010/0303876 A1 | 12/2010 | Klein et al. |

FOREIGN PATENT DOCUMENTS

| | | |
|---|---|---|
| EP | 1 683 592 A1 | 7/2006 |
| EP | 2 030 706 A1 | 3/2009 |
| EP | 2 119 747 A1 | 11/2009 |
| EP | 2 139 007 A1 | 12/2009 |
| EP | 2 147 733 A1 | 1/2010 |
| EP | 2 468 827 A1 | 6/2012 |
| EP | 2 608 217 A1 | 6/2013 |
| EP | 2 608 218 A1 | 6/2013 |
| EP | 2 671 927 A1 | 12/2013 |
| EP | 2 781 562 A1 | 9/2014 |
| WO | 2006/076603 A2 | 7/2006 |
| WO | 2007/118669 A1 | 10/2007 |
| WO | 2007/120756 A2 | 10/2007 |
| WO | 2008/049519 A1 | 5/2008 |
| WO | 2008/151066 A1 | 12/2008 |
| WO | 2009/152388 A1 | 12/2009 |
| WO | 2009/157393 A1 | 12/2009 |

OTHER PUBLICATIONS

Ledwith et al., "Approaches to the Synthesis and Characterization of Spherical and Anisotropic Silver Nanomaterials", Metallic Nanomaterials, vol. 1, 2009, pp. 99-147.

METALLIC NANOPARTICLE DISPERSION

CROSS REFERENCE TO RELATED APPLICATIONS

This application is a 371 National Stage Application of PCT/EP2015/079281, filed Dec. 10, 2015. This application claims the benefit of priority to European Application No. 14199745.2, filed Dec. 22, 2014, which is incorporated by reference herein in its entirety.

BACKGROUND OF THE INVENTION

1. Field of the Invention

The present invention relates to a metallic nanoparticle dispersion comprising specific dispersion stabilizing compounds, and to conductive inks and pastes prepared therefrom. The dispersion stabilizing compounds confer to the dispersion improved stability, even at low viscosities. The invention also relates to a method of preparing the metallic nanoparticle dispersion and to conductive layers or patterns formed with these metallic nanoparticle dispersion at moderate curing conditions.

2. Description of the Related Art

The interest in metallic printing or coating fluids comprising metallic nanoparticles has increased during the last decades due to their unique properties when compared to the bulk properties of a given metal. For example, the melting point of metallic nanoparticles decreases with decreasing particle size making them of interest for printed electronics, electrochemical, optical, magnetic and biological applications.

The production of stable and concentrated metallic printing or coating fluids which can be printed, for example by inkjet printing, or coated at high speed is of great interest as it enables the preparation of electronic devices at low costs.

Metallic printing or coating fluids are typically a metallic nanoparticle dispersion comprising metallic nanoparticles and a dispersion medium. Such metallic nanoparticle dispersions can be directly used as a printing or coating fluid. However, additional ingredients are often added to the metallic nanoparticle dispersion to optimize the properties of the resulting metallic printing or coating fluids.

The preparation of metallic nanoparticles is may be carried out in water or organic solvents by the so-called polyol synthesis as disclosed in for example 'Approaches to the synthesis and Characterization of Spherical and Anisotropic Silver Nanomaterials', Metallic Nanomaterials Vol. 1, Edited by Challa S. S. R. Kumar, Wiley-VCH Verlag GmbH&Co. KGaA, Weinheim, by a derivative of the polyol synthesis methodology or by an in-situ reduction of metallic salts in the presence of various reducing agents. Such methods are disclosed in for example US2010143591, US2009142482, US20060264518, EP-A 2147733, EP-A 2139007, EP-A 803551, EP-A 2012952, EP-A 2030706, EP-A 1683592, EP-A166617, EP-A 2119747, EP-A 2087490, EP-A 2010314, WO2008/151066, WO2006/076603, WO2009/152388, WO2009/157393.

A polymeric dispersant is often used in the preparation of the metallic nanoparticles to obtain stable metallic printing or coating fluids. The polyol synthesis to prepare silver nanoparticles referred to above is typically carried out in the presence of polyvinylpyrrolidone (PVP). Non-stable metallic nanoparticle dispersions may lead to irreversible phase separation causing among others clogging of coating or print heads. Agglomeration of the metallic nanoparticles may also result in a decrease of the conductivity.

Polymeric dispersants typically contain in one part of the molecule so-called anchor groups, which adsorb onto the metallic particles to be dispersed. In another part of the molecule, polymeric dispersants have polymer chains compatible with the dispersion medium and all the ingredients present in the final printing or coating fluids.

Polymeric dispersants are typically homo- or copolymers prepared from acrylic acid, methacrylic acid, vinyl pyrrolidinone, vinyl butyral, vinyl acetate or vinyl alcohol monomers.

Typically, after applying the metallic printing or coating fluids on a substrate, a sintering step, also referred to as curing step, at elevated temperatures is carried out to induce/enhance the conductivity of the applied patterns of layers. The organic components of the metallic printing or coating fluids, for example the polymeric dispersants, may reduce the sintering efficiency and thus the conductivity of the applied patterns of layers. For this reason, higher sintering temperatures and longer sintering times are often required to decompose the organic components.

Typical polymeric dispersants, such as those described above, are characterized by a full decomposition temperature of at least 350° C. Therefore, the layers or patterns coated or printed with metallic printing or coating fluids comprising such polymeric dispersants typically require a sintering step at elevated temperatures to be sure that most of the polymeric dispersants are decomposed.

Such high sintering temperatures are not compatible with common polymer foils, such as polyethylene terephthalate (PET) or polycarbonate, which have relatively low glass transition temperatures. This restricts the choice to more expensive polymers such as polyimide.

There is thus an interest in lowering the sintering temperatures needed to obtain conductive layers or patterns.

EP-A 2468827 discloses polymeric dispersants, which have 95 wt % decomposition at a temperature below 300° C., as measured by Thermal Gravimetric Analysis. By using metallic printing or coating fluids comprising such polymeric dispersants, the sintering temperature and time could be reduced. In EP-A2608218 and EP-A 2608217 a so called sintering additive is used in combination with a polymeric dispersant of EP-A 2468827 to further lower the sintering temperature.

EP-A 2671927 discloses a metallic nanoparticle dispersion comprising a specific dispersion medium, for example 2-pyrrolidone, resulting in a more stable dispersion without using a polymeric dispersant.

However, there is still a need to further improve the stability of metallic nanoparticle dispersions, especially of metallic nanoparticle dispersions used in inkjet printing methods, without negatively affecting the conductivity and/or the curing parameters of coatings or pattern obtained with the dispersions.

SUMMARY OF THE INVENTION

Preferred embodiments of the present invention provide a stable metallic nanoparticle dispersion wherewith highly conductive coatings or patterns can be obtained, for example with an inkjet printing method, at moderate curing conditions. This object is realized by the metallic nanoparticle dispersion as defined below.

Further preferred embodiments of the invention provide a preparation method of the metallic nanoparticle dispersion as defined below.

Further advantages and embodiments of the present invention will become apparent from the following description and the dependent claims.

DETAILED DESCRIPTION OF THE PREFERRED EMBODIMENTS

Definitions

The terms polymeric support and foil, as used herein, mean a self-supporting polymer-based sheet, which may be associated with one or more adhesion layers, e.g. subbing layers. Supports and foils are usually manufactured through extrusion.

The term layer as used herein, is considered not to be self-supporting and is manufactured by coating or spraying it on a (polymeric) support or foil.

PET is an abbreviation for polyethylene terephthalate.

The term alkyl means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl etc.

Unless otherwise specified a substituted or unsubstituted alkyl group is preferably a $C_1$ to $C_6$-alkyl group.

Unless otherwise specified a substituted or unsubstituted alkenyl group is preferably a $C_2$ to $C_6$-alkenyl group.

Unless otherwise specified a substituted or unsubstituted alkynyl group is preferably a $C_2$ to $C_6$-alkynyl group.

Unless otherwise specified a substituted or unsubstituted aralkyl group is preferably a phenyl group or a naphthyl group including one, two, three or more $C_1$ to $C_6$-alkyl groups.

Unless otherwise specified a substituted or unsubstituted alkaryl group is preferably a $C_1$ to $C_6$-alkyl group including an aryl group, preferably a phenyl group or naphthyl group.

Unless otherwise specified a substituted or unsubstituted aryl group is preferably a substituted or unsubstituted phenyl group or naphthyl group.

A cyclic group includes at least one ring structure and may be a monocyclic- or polycyclic group, meaning one or more rings fused together.

A heterocyclic group is a cyclic group that has atoms of at least two different elements as members of its ring(s). The counterparts of heterocyclic groups are homocyclic groups, the ring structures of which are made of carbon only. Unless otherwise specified a substituted or unsubstituted heterocyclic group is preferably a five- or six-membered ring substituted by one, two, three or four heteroatoms, preferably selected from oxygen atoms, nitrogen atoms, sulphur atoms, selenium atoms or combinations thereof.

An alicyclic group is a non-aromatic homocyclic group wherein the ring atoms consist of carbon atoms.

The term heteroaryl group means a monocyclic- or polycyclic aromatic ring comprising carbon atoms and one or more heteroatoms in the ring structure, preferably, 1 to 4 heteroatoms, independently selected from nitrogen, oxygen, selenium and sulphur. Preferred examples of heteroaryl groups include, but are not limited to, pyridinyl, pyridazinyl, pyrimidyl, pyrazyl, triazinyl, pyrrolyl, pyrazolyl, imidazolyl, (1,2,3)- and (1,2,4)-triazolyl, pyrazinyl, pyrimidinyl, tetrazolyl, furyl, thienyl, isoxazolyl, thiazolyl, isoxazolyl, and oxazolyl. A heteroaryl group can be unsubstituted or substituted with one, two or more suitable substituents. Preferably, a heteroaryl group is a monocyclic ring, wherein the ring comprises 1 to 5 carbon atoms and 1 to 4 heteroatoms.

The term substituted, in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

Unless otherwise specified a substituted alkyl group, a substituted alkenyl group, a substituted alkynyl group, a substituted aralkyl group, a substituted alkaryl group, a substituted aryl, a substituted heteroaryl and a substituted heterocyclic group are preferably substituted by one or more substituents selected from the group consisting of methyl, ethyl, n-propyl, isopropyl, n-butyl, 1-isobutyl, 2-isobutyl and tertiary-butyl, ester, amide, ether, thioether, ketone, aldehyde, sulfoxide, sulfone, sulfonate ester, sulphonamide, —Cl, —Br, —I, —OH, —SH, —CN and —NO$_2$.

The Metallic Nanoparticle Dispersion

The metallic nanoparticle dispersion according to the present invention comprises metallic nanoparticles, a liquid carrier and a dispersion-stabilizing compound (DSC).

The metallic nanoparticle dispersion may further comprise a polymeric dispersant and additives to further optimize its properties.

Dispersion-Stabilizing Compound (DSC)

The metallic nanoparticle dispersion according to the present invention comprises metallic nanoparticles and a liquid carrier characterized in that the dispersion further includes a dispersion-stabilizing compound (DSC) according to Formulae I, II, III or IV,

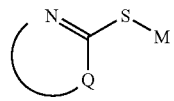

Formula I

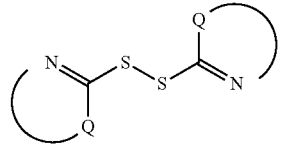

Formula II

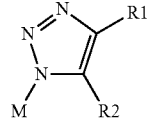

Formula III

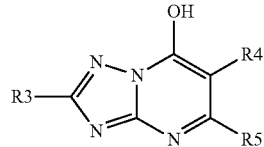

Formula IV wherein
  Q represents the necessary atoms to form a substituted or unsubstituted five or six membered heteroaromatic ring;
  M is selected from the group consisting of a proton, a monovalent cationic group and an acyl group;
  R1 and R2 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thioether, an ether, an ester, an amide, an amine, a halogen, a ketone and an aldehyde;

R1 and R2 may represent the necessary atoms to form a five to seven membered ring;

R3 to R5 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thiol, a thioether, a sulfone, a sulfoxide, an ether, an ester, an amide, an amine, a halogen, a ketone, an aldehyde, a nitrile and a nitro group; R4 and R5 may represent the necessary atoms to form a five to seven membered ring.

The dispersion-stabilizing compound is preferably a compound according to Formula I.

The dispersion-stabilizing compound is more preferably a compound according to Formula I, wherein Q represents the necessary atoms to form a five membered heteroaromatic ring.

A particular preferred dispersion-stabilizing compound is a compound according Formula I, wherein Q is a five membered heteroaromatic ring selected from the group consisting of an imidazole, a benzimidazole, a triazole, a benzothiazole, an oxazole, a benzoxazole, a 1,2,3-triazole, a 1,2,4-triazole, an oxadiazole, a thiadiazole and a tetrazole.

Some examples of dispersion-stabilizing compounds according to the present invention are shown in the following table.

| DSC | Chemical Formula |
|---|---|
| DCS-01 | 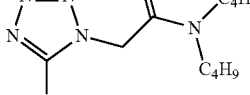 |
| DCS-02 | |
| DCS-03 | |
| DCS-04 | |
| DCS-05 | 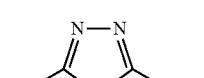 |
| DCS-06 | |
| DCS-07 | 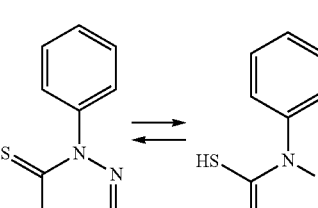 |
| DCS-08 | |
| DCS-09 | 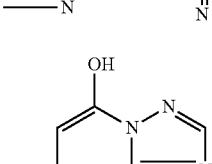 |
| DCS-10 | |
| DCS-11 | 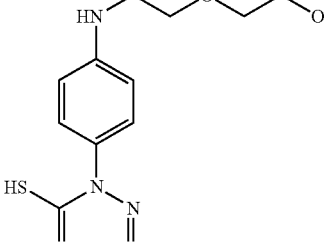 |

-continued

| DSC | Chemical Formula |
|---|---|
| DCS-12 | (structure: tetrazole with SH and N-CH2-C(O)-O-CH3) |
| DCS-13 | (structure: acetamido-phenyl-tetrazole with HS) |
| DCS-14 | (structure: HS-triazole with N-methyl and COOH) |
| DCS-15 | (structure: HS-triazole with N-methyl and CH2-NH-C(O)-O-tBu) |
| DCS-16 | (structure: HS-triazole with N-phenyl and propyl-OH) |

The dispersion-stabilizing compound is preferably selected from the group consisting of N,N-dibutyl-(2,5-dihydro-5-thioxo-1H-tetrazol-1-yl-acetamide, 5-heptyl-2-mercapto-1,3,4-oxadiazole, 1-phenyl-5-mercaptotetrazol, 5-methyl-1,2,4-triazolo-(1,5-a) primidine-7-ol, and S-[5-[(ethoxycarbonyl)amino]-1,3,4-thiadiazol-2-yl] O-ethyl thiocarbonate.

The dispersion-stabilizing compounds according to Formula I to IV are preferably non-polymeric compounds. Non-polymeric compounds as used herein means compounds having a Molecular Weight which is less preferably than 1000, more preferably less than 500, most preferably less than 350.

The amount of the dispersion-stabilizing compounds (DSC) expressed as wt % relative to the total weight of silver (Ag) in the metallic nanoparticles is preferably between 0.005 and 10.0, more preferably between 0.0075 and 5.0, most preferably between 0.01 and 2.5. When the amount of the dispersion-stabilizing compound relative to the total weight of silver in the metallic nanoparticles is too low, the stabilizing effect may be too low, while a too high amount of the dispersion-stabilizing compound may adversely affect the conductivity of the coating or patterns obtained with the metallic nanoparticle dispersion.

Metallic Nanoparticles

The metallic nanoparticle dispersion of the present invention comprises metallic nanoparticles.

The metallic nanoparticles comprise one or more metals in elemental or alloy form. The metal is preferably selected from the group consisting of silver, gold, copper, nickel, cobalt, molybdenum, palladium, platinum, tin, zinc, titanium, chromium, tantalum, tungsten, iron, rhodium, iridium, ruthenium, osmium, aluminium and lead. Metallic nanoparticles based on silver, copper, molybdenum, aluminium, gold, copper, or a combination thereof, are particularly preferred. Most preferred are metallic nanoparticles based on silver.

The term "nanoparticles" refers to dispersed particles having an average particle size or average particle diameter of less than 100 nm, preferably less than 50 nm, more preferably less than 30 nm, most preferably less than 20 nm.

The metallic nanoparticle dispersion preferably comprises at least 5 wt %, more preferably at least 10 wt %, most preferably at least 15 wt %, particularly preferred at least 20 wt % of metallic nanoparticles, relative to the total weight of the dispersion.

Polymeric Dispersant

The metallic nanoparticle dispersion may contain a polymeric dispersant.

Polymeric dispersants typically contain in one part of the molecule so-called anchor groups, which adsorb onto the metallic particles to be dispersed. In another part of the molecule, polymeric dispersants have polymer chains compatible with the dispersion medium, also referred to as liquid vehicle, and all the ingredients present in the final printing or coating fluids.

Polymeric dispersants are typically homo- or copolymers prepared from acrylic acid, methacrylic acid, vinyl pyrrolidinone, vinyl butyral, vinyl acetate or vinyl alcohol monomers.

The polymeric dispersants disclosed in EP-A 2468827, having a 95 wt % decomposition at a temperature below 300° C. as measured by Thermal Gravimetric Analysis may also be used.

However, in a preferred embodiment the metallic nanoparticle dispersion according to the present invention comprises less than 5 wt % of a polymeric dispersant relative to the total weight of the dispersion, more preferably less than 1 wt %, most preferably less than 0.1 wt %. In a particularly preferred embodiment the dispersion comprises no polymeric dispersant at all.

Liquid Carrier

The metallic nanoparticle dispersion comprises a liquid carrier.

The liquid carrier is preferably an organic solvent. The organic solvent may be selected from alcohols, aromatic hydrocarbons, ketones, esters, aliphatic hydrocarbons, higher fatty acids, carbitols, cellosolves, and higher fatty acid esters.

Suitable alcohols include methanol, ethanol, propanol, 1-butanol, 1-pentanol, 2-butanol, t-butanol.

Suitable aromatic hydrocarbons include toluene and xylene.

Suitable ketones include methyl ethyl ketone, methyl isobutyl ketone, 2,4-pentanedione and hexa-fluoroacetone.

Also glycol, glycolethers, N,N-dimethyl-acetamide, N,N-dimethylformamide may be used.

A mixture of organic solvents may be used to optimize the properties of the metallic nanoparticle dispersion.

Preferred organic solvents are high boiling solvents. High boiling organic solvents referred to herein are solvents which have a boiling point that is higher than the boiling point of water (>100° C.)

Preferred high boiling solvents are shown in the following table.

| Chemical formula | Chemical name | Bp (° C.) |
|---|---|---|
| | 2-fenoxy ethanol (ethylene glycol monophenylether) | 247 |
| | 4-methyl-1,3-dioxolan-2-one (propylene carbonate) | 242 |
| | n-butanol | 117 |
| | 1,2-propanediol | 211-217 |
| | 4-hydroxy-4-methylpentan-2-one (diaceton alcohol) | 168 |
| | Pentan-3-one (diethyl ketone) | 102 |
| | 2-Butoxyethanol Ethylene glycol monobutyl ether | 171 |
| | Dihydrofuran-2(3H)-one (Gamma-butyrolacton) | 204 |
| | 1-methoxy-2-propanol (propyleneglycolmonomethylether) | 120 |

Particularly preferred high boiling solvents are 2-fenoxy ethanol, gamma-butyro-lactone, and mixtures thereof.

The liquid carrier may also comprise solvents which are used in the preparation method of the nanoparticles, such as solvents according to Formula V described below.

The amount of the liquid carrier depends on the desired viscosity of the printing or coating fluid. The amount of the liquid carrier is preferably less than 95 wt %, more preferably less than 90 wt %, most preferably less than 85 wt % relative to the total weight of the metallic nanoparticle dispersion.

Additives

To optimize the coating or printing properties, and also depending on the application for which it is used, additives such as reducing agents, wetting/levelling agents, dewettting agents, rheology modifiers, adhesion agents, tackifiers, humectants, jetting agents, curing agents, biocides or antioxidants may be added to the metallic nanoparticle dispersion described above.

The metallic nanoparticle dispersion preferably comprises a surfactant. Preferred surfactants are Byk® 410 and 411, both solutions of a modified urea, and Byk® 430, a solution of a high molecular urea modified medium polar polyamide.

The amount of the surfactants is preferably between 0.01 and 10 wt %, more preferably between 0.05 and 5 wt %, most preferably between 0.1 and 0.5 wt %, relative to the total amount of the metallic nanoparticle dispersion.

It may be advantageous to add a small amount of a metal of an inorganic acid or a compound capable of generating such an acid during curing of a metallic layer or pattern formed from the metallic nanoparticle dispersion such as disclosed in EP-A 13175029.1 (filed Apr. 7, 2013). Higher conductivities and/or lower curing temperatures were observed of layers or patterns formed from such metallic nanoparticle dispersions.

Higher conductivities and/or lower curing temperatures may also be obtained when using metallic nanoparticles dispersions containing a compound according to Formula X, as disclosed in EP13175033.3 (filed Apr. 7, 2013).

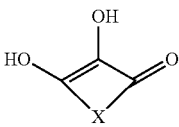

Formula X wherein

X represents the necessary atoms to form a substituted or unsubstituted ring.

A particularly preferred compound according to Formula X is an ascorbic or erythorbic acid derivative compound.

Preparation of the Metallic Nanoparticle Dispersion

The preparation of the metallic nanoparticle dispersion according to the present invention typically comprises the addition of the liquid carrier, the dispersion-stabilizing compound and optional additives to the metallic nanoparticles by using a homogenization technique such as stirring, high shear mixing, ultra-sonication, or a combination thereof.

The metallic nanoparticles from which the metallic nanoparticle dispersion is made is typically a paste or a highly concentrated dispersion of metallic nanoparticles. A preferred preparation method of the metallic nanoparticles is described below.

It has been observed that better results are obtained when all, or a portion, of the dispersion-stabilizing compound are added during the preparation method of the metallic nanoparticles, as described below. Due to their adsorption to the metallic nanoparticles, the dispersion-stabilizing compounds added during the preparation of the metallic nanoparticles will be retained, at least partially, in the final metallic nanoparticle disperision, even if one or more washing steps have been carried out in the preparation method.

The homogenization step can be carried out at elevated temperature up to 100° C. In a preferred embodiment, the homogenization step is carried out at temperature equal or below 60° C.

In a preferred embodiment, the metallic nanoparticle dispersion is used in an inkjet printing method. Such a metallic nanoparticle dispersion, also referred to as metallic inkjet fluid or ink or conductive inkjet fluid or ink, preferably has a viscosity lower than 35 mPa·s, preferably lower than 28 mPa·s, and most preferably between 2 and 25 mPa·s at 25° C. and measured at a shear rate of 90 s$^{-1}$.

When using so-called throughflow printheads, the viscosity of the metallic inkjet fluid may be higher, preferably below 60 mPa·s at 25° C. and at a shear rate of 90 s$^{-1}$. A higher viscosity limit for the metallic inkjet fluid opens up more compositional variations of the fluid which may be advantageous towards more concentrated and/or more stable metallic inkjet fluids In another preferred embodiment, the metallic nanoparticle dispersion is used in a flexographic printing process. Such a metallic nanoparticle dispersion, also referred to as metallic flexo ink or conductive flexo ink, preferably has a viscosity between 10 and 200 mPa·s, more preferably between 25 and 150 mPa·s, most preferably between 50 and 100 mPa·s measured at 25° C. and at a shear rate of 90 s$^{-1}$.

Metallic Layers or Patterns

Thin layers or patterns printed or coated from the metallic nanoparticle dispersion can be rendered conductive at lower sintering temperatures compared to those obtained with conventional metallic printing or coating fluids. Therefore, conductive thin layers or patterns made from the metallic printing or coating fluids of the present invention can be coated or printed on flexible supports that can not withstand thermal treatment at high temperature, such as for example PET.

The metallic layers or patterns are prepared by a method comprising the steps of applying a metallic nanoparticle dispersion as defined above on a support followed by a sintering step.

The support may a glass, a paper or a polymeric support.

Preferred polymeric supports are polycarbonate, polyethylene terephthalate (PET) or polyvinylchloride (PVC) based supports.

The above mentioned supports may be provided with one or more layers to improve the adhesion, absorption or spreading of the applied conductive inkjet or flexo inks.

Polymeric supports are preferably provided with so-called subbing layers to improve the adhesion of the applied conductive inkjet or flexo inks. Such subbing layers are typically based on vinylidene copolymers, polyesters, or (meth)acrylates.

Useful subbing layers for this purpose are well known in the art and include, for example, polymers of vinylidene chloride such as vinylidene chloride/acrylonitrile/acrylic acid terpolymers or vinylidene chloride/methyl acrylate/itaconic acid terpolymers.

Suitable vinylidene chloride copolymers include: the copolymer of vinylidene chloride, N-tert.-butylacrylamide, n-butyl acrylate, and N-vinyl pyrrolidone (e.g. 70:23:3:4), the copolymer of vinylidene chloride, N-tert.-butylacrylamide, n-butyl acrylate, and itaconic acid (e.g. 70:21:5:2), the copolymer of vinylidene chloride, N-tert.-butylacrylamide, and itaconic acid (e.g. 88:10:2), the copolymer of vinylidene chloride, n-butylmaleimide, and itaconic acid (e.g. 90:8:2), the copolymer of vinyl chloride, vinylidene chloride, and methacrylic acid (e.g. 65:30:5), the copolymer of vinylidene chloride, vinyl chloride, and itaconic acid (e.g. 70:26:4), the copolymer of vinyl chloride, n-butyl acrylate, and itaconic acid (e.g. 66:30:4), the copolymer of vinylidene chloride, n-butyl acrylate, and itaconic acid (e.g. 80:18:2), the copolymer of vinylidene chloride, methyl acrylate, and itaconic acid (e.g. 90:8:2), the copolymer of vinyl chloride, vinylidene chloride, N-tert.-butylacrylamide, and itaconic acid (e.g. 50:30:18:2). All the ratios given between brackets in the above-mentioned copolymers are ratios by weight.

Other preferred subbing layers include a binder based on a polyester-urethane copolymer. In a more preferred embodiment, the polyester-urethane copolymer is an ionomer type polyester urethane, preferably using polyester segments based on terephthalic acid and ethylene glycol and hexamethylene diisocyanate. A suitable polyester-urethane copolymer is Hydran™ APX101 H from DIC Europe GmbH.

The application of subbing layers is well-known in the art of manufacturing polyester supports for silver halide photographic films. For example, the preparation of such subbing layers is disclosed in U.S. Pat. No. 3,649,336 and GB 1441591.

In a preferred embodiment, the subbing layer has a dry thickness of no more than 0.2 μm or preferably no more than 200 mg/m$^2$.

Another preferred support is an ITO based support. Such a support is typically a glass or polymer support whereupon an ITO layer or pattern is provided.

A preferred paper based support is the Powercoat® paper substrate, a substrate designed for printed electronics by Arjowiggins Creative Papers.

Multiple metallic layers or patterns, i.e. a stack of patterned or unpatterned layers, may be applied on a substrate. The support referred to in the method of preparing the metallic layers or patterns thus also encompass a previously applied metallic layer or pattern.

Metallic layers may be provided onto a support by co-extrusion or any conventional coating technique, such as dip coating, knife coating, extrusion coating, spin coating, spray coating, blade coating, slot die coating, slide hopper coating and curtain coating.

Metallic layers and in particular metallic patterns may be provided onto a support by a printing method such as intaglio printing, screen printing, flexographic printing, offset printing, inkjet printing, gravure offset printing, etc.

Preferred printing methods are an inkjet and flexographic printing method.

Another method to provide a metallic layer or pattern on a support is aerosol jet printing. Aerosol Jet Printing, which has been developed by Optomec, preserves most of the advantages of inkjet printing, while reducing many of its limitations. The technique is developed for use in the field of printed electronics. The technique is disclosed in for example US2003/0048314, US2003/0020768, US2003/0228124 and WO2009/049072. An Aerosol Jet Print Engine is commercially available from Optomec, for example the Aerosol Jet Printer OPTOMEC AJ 300 CE.

Virtually any liquid having a viscosity less than 5000 mPa·s can be deposited using the Aerosol Jet Printing technique. Using higher viscous fluids may be advantageous with respect to the stability of the metallic inks Inkjet Printing Devices Various embodiments of an apparatus for creating conductive layers or pattern from the metallic nanoparticle dispersion according to the present invention by inkjet printing may be used.

In a flat bed printing device a support is provided on a flat bed. Droplets of a metallic inkjet fluid are jetted from a print head on the support.

The print heads typically scan back and forth in a transversal direction (x-direction) across a moving support (y-direction). Such bi-directional printing is referred to as multi-pass printing.

Another preferred printing method is the so-called single-pass printing method wherein the print heads, or multiple staggered print heads, cover the entire width of the support.

In such a single-pass printing method, the print heads usually remain stationary while the support is transported under the print heads (y-direction).

To obtain maximal dot placement accuracy, the print heads are positioned as close as possible to the surface of the support. The distance between the print heads and the surface of the support is preferably less than 3 mm, more preferably less than 2 mm, most preferably less than 1 mm.

As the distance between the printhead and the surface of the support may influence the dot placement accuracy, it may be advantageous to measure the thickness of a support and adapting the distance between the printhead and the surface of the support based on the measurement of the thickness of the support.

The distance between a stationary printhead and the surface of a support mounted on the printing device may also vary over the whole support, due to for example waviness of the support, or other irregularities in the surface of the support. Therefore it may also be advantageous to measure the surface topography of the support and to compensate the differences in the measured surface topography by controlling the so-called firing time of the droplets of curable fluids on the support, or by adjusting the distance between the printhead and the surface of the support. Examples of measurement devices to measure the surface topography of a lithographic supports is disclosed in ISO 12635:2008(E).

In a preferred embodiment the inkjet printing device has holding down means, such as a vacuum chamber under the support, to hold down the support in a so-called hold-down zone, for example by vacuum. In a more preferred embodiment the support is hold down against the support by independent working holding down means such as a plurality of vacuum chambers under the support which are independently controlled to enhance the vacuum pressure on the support so that more than one hold down zones are generated on the support. The holding down of the support enhances the drop placement of the jetted droplets and position accuracy.

Print Head

A preferred print head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the print head creating a void, which is then filled with ink. When the voltage is again removed, the ceramic expands to its original shape, ejecting a drop of ink from the print head. However the inkjet printing method according to the present invention is not restricted to piezoelectric inkjet printing. Other inkjet print heads can be used and include various types, such as the continuous printing type.

Preferred print heads eject droplets having a volume ≤50 pl, more preferably ≤35 pl, most preferably ≤25 pl, particularly preferred ≤15 pl.

Another preferred print head is a throughflow piezoelectric inkjet print head. A throughflow piezoelectric inkjet print head is a print head wherein a continuous flow of liquid is circulating through the liquid channels of the print head to avoid agglomerations in the liquid which may cause disturbing effects in the flow and bad drop placements. Avoiding bad drop placements by using throughflow piezoelectric inkjet print heads may improve the quality of the conductive patterns on the support. Another advantage of using such throughflow print heads is a higher viscosity limit of the curable fluids to be jetted, widening the scope of compositional variations of the fluids.

Curing Step

After the layers or patterns are applied on the support, a sintering step, also referred to as curing step, is carried out. During this sintering step, solvents evaporate and the metallic particles sinter together. Once a continuous percolating network is formed between the metallic particles, the layers or patterns become conductive. Conventional sintering is typically carried out by applying heat. The sintering temperature and time are dependent on the support used and on the composition of the metallic layer or pattern. The sintering step for curing the metallic layers may be performed at a temperature below 250° C., preferably below 200° C., more preferably below 180° C., most preferably below 160° C.

The sintering time may be less than 60 minutes, preferably between 2 and 30 minutes and more preferably between 3 and 20 minutes, depending on the selected temperature, support and composition of the metallic layers.

However, instead of or in addition to the conventional sintering by applying heat, alternative sintering methods such as exposure to an Argon laser, to microwave radiation, to UV radiation or to low pressure Argon plasma, photonic curing, plasma or plasma enhanced, electron beam, laser beam or pulse electric current sintering may be used.

Another curing method uses the so-called Near infrared (NIR) curing technology. The metal of the coating or the pattern, for example silver, may act as absorber for the NIR radiation.

The metallic layers of the present invention allow to use lower curing temperatures than the prior art processes. In consequence it is possible to use polymeric substrates that can not withstand thermal treatment at high temperature, such as for example PET. The curing time may also be substantially reduced leading to the possibility of having higher production per hour than the prior art processes. The conductivity of the metallic layers are maintained or even improved in certain cases.

To further increase the conductivity or to lower the curing temperature it may be advantageous to contact the metallic layer or pattern with a solution containing an acid or an acid precursor capable or releasing the acid during curing of the metallic layer or pattern, as disclosed in EP-A 13175030.9 (filed on Apr. 7, 2013).

The metallic layers or patterns may be used in various electronic devices or parts of such electronic devices as for example organic photo-voltaics (OPV's), inorganic photo-voltaics (c-Si, a-Si, CdTe, CIGS), OLED displays, OLED lighting, inorganic lighting, RFID's, organic transistors, thin film batteries, touch-screens, e-paper, LCD's, plasma, sensors, membrane switches or electromagnetic shielding.

Preparation of the Metallic Nanoparticles

The metallic nanoparticle nanoparticles according to the present invention may be prepared by any known preparation method.

A preferred method to prepare the metallic nanoparticles comprises:

a dispersing step wherein metallic or metallic precursor particles are dispersed in a dispersion medium comprising a solvent according to Formula V,

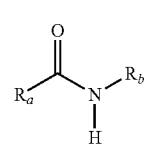

Formula V wherein
Ra and Rb represent an optionally substituted alkyl group, and
Ra and Rb may form a ring
a washing step with a washing liquid comprising water wherein the solvent according to Formula V is substantially removed, and
an evaporation step wherein water is substantially removed,
characterized in that the evaporation step is carried out in the presence of a high boiling solvent and a dispersion-stabilizing compound according to Formulae I to IV described above.

High boiling organic solvents referred to herein are solvents which have a boiling point that is higher than the boiling point of water (>100° C.)

Preferred high boiling solvents are those described above as liquid carrier of the metallic nanoparticle dispersion.

Dispersing methods include precipitation, mixing, milling, in-situ synthesis or a combination thereof. The experimental conditions such as temperature, process time, energy input, etc. depend on the methodology chosen. The dispersion process can be carried out in a continuous, batch or semi-batch mode.

Mixing apparatuses may include a pressure kneader, an open kneader, a planetary mixer, a dissolver, a high shear stand mixer, and a Dalton Universal Mixer. Suitable milling and dispersion apparatuses are a ball mill, a pearl mill, a colloid mill, a high-speed disperser, double rollers, a bead mill, a paint conditioner, and triple rollers. Many different types of materials may be used as milling media, such as glasses, ceramics, metals, and plastics. The dispersions may also be prepared using ultrasonic energy.

The term 'nanoparticles' refers to dispersed particles having an average particle size below 100 nm at the end of the dispersion preparation. Before the dispersion preparation step, the metallic particles or the metal precursor particles are typically available as powders, flakes, particles or aggregated particles. When their average size is above 100 nm, the dispersion step includes necessarily a down-sizing step including the actions of milling or de-aggregating until the particles size is lowered to the nanoparticle range. Prior to the dispersion preparation the flakes or powders can be down-sized by mean of dry milling, wet-milling, or sieving techniques. The conversion of metal precursor(s) to metal(s) can be concomitant to the down-sizing step.

In a preferred embodiment the dispersion medium comprises a solvent according to Formula VI,

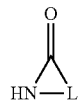

Formula VI wherein
L is an optionally substituted linear or branched $C_2$-$C_{11}$ alkylene group.

In a more preferred embodiment the dispersion medium comprises a solvent selected from an optionally substituted 2-pyrrolidone, β-lactam, γ-lactam, δ-lactam, or ε-lactam.

In an even more preferred embodiment the metallic nanoparticle dispersion comprises as dispersion medium a solvent selected from 2-pyrrolidone, 4-hydroxy-2-pyrrolidone, δ-valerolactam or ε-caprolactam.

In a most preferred embodiment the dispersion medium comprises 2-pyrrolidone.

The metallic nanoparticle dispersion comprises the solvent as defined above in an amount between 1 and 99 wt %, preferably between 5 and 90 wt %, more preferably between 10 and 70 wt %, most preferably between 20 and 50 wt %, relative to the total weight of the dispersion.

The dispersion medium of the metallic nanoparticle dispersion may comprise, in addition to the solvent according to Formula V or VI, a co-solvent, preferably an alcohol or a ketone. The co-solvent is more preferably ethanol or methylethyl ketone (MEK). The co-solvent may be present from the start of the preparation of the metallic nanoparticle dispersion or may be added during or at the end of the preparation.

The amount of co-solvent is preferably between 0 and 75 wt %, more preferably between 5 and 70 wt % relative to the total dispersion medium amount.

In a preferred embodiment the metallic nanoparticle dispersion is prepared by an in-situ reduction under mixing of a metal precursor such as a metal oxide, a metal hydroxide, a metal salt or a combination thereof, in the presence of a reducing agent in the dispersion medium of the present invention.

Preferred metal oxide nanoparticles are based on silver oxide, tin oxide, titanium oxide, zirconium oxide, wolfram oxide, molybdenum oxide, cadmium oxide, cupper oxide or zinc oxide.

Also doped metal oxide nanoparticles such as ZnO:Al, $SnO_2$:F or $SnO_2$:Sb may be used.

Preferred metal hydroxide particles are based on copper hydroxide, titanium hydroxide, zirconium hydroxide, wolfram hydroxide, molybdenum hydroxide, cadmium hydroxide or zinc hydroxide.

Preferred metal salts include inorganic acid salts, such as nitrates, carbonates, chlorides, phosphates, borates, sulfonates and sulfates, and organic acid salts, such as stearate, myristate or acetate.

As mentioned above, particularly preferred metallic nanoparticles are silver nanoparticles. These may be prepared, for example, by the reduction of silver oxide or silver acetate.

The degree of reduction of the metal precursor to metallic nanoparticles is preferably between 60 and 100%.

The reducing agents are soluble in the dispersion medium and can be selected from the groups of hydroxylamine and derivatives thereof, formic acid, oxalic acid, ascorbic acid, hydrazine and derivatives thereof, dithiothreitol (DTT), phosphites, hydrophosphites, phosphorous acid and derivatives thereof, lithium aluminum hydride, diisobutylaluminum hydride, sodium borohydride, sulfites, tin(II) complexes, iron(II) complexes, zinc mercury amalgam, sodium amalgam, atomic hydrogen, or Lindlar catalyst.

According to a preferred embodiment metallic silver nanoparticles are prepared by an in-situ reduction under mixing of silver oxide with a reductant. The reductant comprises preferably at least 50 wt % of formic acid relative to the total weight of the reductant.

The pH of the metallic nanoparticle dispersion is preferably between 7 and 10, more preferably between 7.4 and 9.0.

The method to prepare the metallic nanoparticle dispersion according to the present invention preferably comprise a washing step.

It has been observed, that when further ingredients, such as a liquid carrier or other additives as described above are added to the metallic nanoparticles prepared as described above, the presence of a solvent according to Formula V or VI may adversely affect the properties of the metallic nanoparticle dispersion thus obtained. For example, when the metallic nanoparticle dispersion is used as a conductive inkjet fluid it has been observed that the presence of 2-pyrrolidone renders the fluid hygroscopic resulting in a destabilizing effect. The presence of 2-pyrrolidone may also result in so-called ink pooling.

It has now been observed that a solvent according to Formula V or VI used in the preparation of the metallic nanoparticles may be removed by a washing step with a washing liquid comprising water, followed by an evaporation step in the presence of a dispersion-stabilizing compound according to Formulae I, II, III or IV described above and a high boiling solvent wherein the water is, at least substantially, removed.

At least substantially removed means that the water content of the metallic nanoparticle dispersion is less than 10 wt %, preferably less than 5.0 wt %, more preferably less than 2.5 wt %, most preferably less than 1.0 wt %.

Adding water to the metallic nanoparticles dispersed in a solvent according to Formula V or VI results in a sedimentation of the nanoparticles. The nanoparticles may then be separated from the supernatant by simple filtration. The washing step with water may be repeated several times. The washing step results in an at least substantially removal of the solvent according to Formula V or VI used in the dispersing step.

Other solvents may be used in combination with water in the washing step(s).

After filtration, the metallic nanoparticles may still contain some water. This water is then removed, at least substantially, at higher temperatures, for example between 30 and 70° C., and/or reduced pressure.

It has been observed that the removal of water is preferably carried out in the presence of a dispersion-stabilizing compound according to Formulae I, II, III or IV described above and a high boiling solvent. High boiling organic solvents referred to herein means an organic solvent having a boiling point which is higher than the boiling point of water. It has been observed that in the absence of such a dispersion-stabilizing compound according to Formulae I, II, III or IV described above and a high boiling solvent, it may be more difficult or even impossible to redisperse the metallic nanoparticles in a liquid carrier.

The method to prepare the metallic nanoparticle dispersion according to the present invention may further comprise a so-called 'concentration step' wherein the dispersion medium is at least partially removed. Such a concentration includes for example ultrafiltration, solvent evaporation, complete or non-complete precipitation or sedimentation in a non-solvent, centrifugation or ultracentrifugation, or a combination thereof. After the 'concentration step' the metallic nanoparticle dispersion may contain more than 25 wt % of metallic nanoparticles, preferably more than 35 wt %, more preferably more than 45 wt %.

EXAMPLES

Materials

All materials used in the following examples were readily available from standard sources such as ALDRICH CHEMICAL Co. (Belgium) and ACROS (Belgium) unless otherwise specified. The water used was deionized water.

DSC-01 is the dispersion-stabilizing compound N-dibutyl-(2,5-dihydro-5-thioxo-1H-tetrazol-1-yl)acetamide (CASRN168612-06-4) commercially available from Chemosyntha.

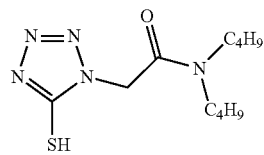

DSC-02 is the dispersion-stabilizing compound 5-heptyl-2-mercapto-1,3,4-oxadiazole (CASRN66473-10-7) commercially available from Ubichem.

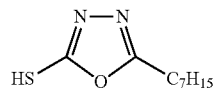

DSC-03 is the dispersion-stabilizing compound 1-phenyl-5-mercaptotetrazol (CASRN86-93-1) commercially available from Sigma Aldrich.

DSC-04 is the dispersion-stabilizing compound 5-methyl-1,2,4-triazolo-(1,5-a) primidine-7-ol (CASRN2503-56-2) commercially available from Sigma Aldrich.

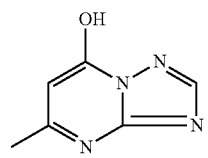

DSC-05 is the dispersion-stabilizing compound ethoxycarbonyl thiothia diazolylcarbamate (CASRN21521-73-3) commercially available from ABI chem.

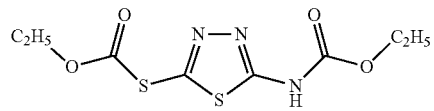 [SMILES: CCOC(=O)Nc1nnc(SC(=O)OCC)s1]

Silver oxide ($Ag_2O$) was prepared by the precipitation of silver nitrate in an alkaline aqueous solution of sodium hydroxide (33 wt %) followed by filtration and drying.

2-fenoxy-ethanol (CASRN122-99-6) commercially available from BASF.

Gamma-butyro-lactone (CASRN96-48-0) commercially available from BASF.

Propylenecarbonate (CASRN108-32-7) commercially available from Sigma Aldrich.

Diaceton alcohol (CASRN123-42-2) commercially available from ACROS CHIMICA.

n-butanol (CASRN71-36-3) commercially available from ACROS CHIMICA.

1,2 propanediol (CASRN57-55-6) commercially available from ACROS CHIMICA.

1-methoxy-2-propanol (CASRN107-98-2) commercially available from DOW CHEMICALS.

2-butoxyethanol (CASRN111-76-2) commercially available from DOW CHEMICALS.

Copol (ViCl2-MA-IA), a copolymer of vinylidenechloride-methacrylic acid and itaconic acid from Agfa Gevaert.

Mersolat H40, a surfactant from Lanxess.

Kieselsol 100F, a silica from Bayer.

Measurements Methods

Conductivity of the Silver Coatings

The surface resistance (SER) of the silver coatings was measured using a four-point collinear probe. The surface or sheet resistance was calculated by the following formula:

$$SER = (\pi / \ln 2) * (V/I)$$

wherein

SER is the surface resistance of the layer expressed in $\Omega/$;

$\pi$ is a mathematical constant, approximately equal to 3.14;

ln 2 is a mathematical constant equal to the natural logarithmic of value 2, approximately equal to 0.693;

V is voltage measured by voltmeter of the four-point probe measurement device;

I is the source current measured by the four-point probe measurement device.

For each sample, three measurements were performed at different positions of the coating and the average value was calculated.

The silver content $M_{Ag}$ (g/m$^2$) of the coatings was determined by WD-XRF.

The conductivity of the coated layers was then determined by calculating the conductivity as a percentage of the bulk conductivity of silver using the following formula:

$$\% \ Ag_{(bulk)} = \frac{\rho_{Ag} * \sigma_{Ag}}{M_{Ag} * SER} * 10^{-5} * 100\%$$

$$\% \ Ag_{(bulk)} = \frac{0.1663}{M_{Ag} * SER} * 100\%$$

wherein $\rho_{Ag}$ is the density of silver (10.49 g/cm$^3$) and $\sigma_{Ag}$ the specific conductivity of silver (equal to 6.3 10$^5$ S/cm).

Stability of the Silver Inkjet Inks

Stability refers to the ability to be stable over a long period of time, which determines the shelf life of an ink or coating formulation and/or the ability to be used with a specific deposition technology and/or having the same properties after use compared to a freshly prepared reference.

Instability of an ink or coating formulation is in many cases related to sedimentation of particles, resulting in reversibly (flocculation) or irreversibly (aggregation, coalescence, Ostwald ripening).

Stability of an ink or coating formulation may be determined by a variety of methods: for example visual inspection, particles size measurements, optical methods, measuring ink stability during inkjetting and/or intended use of the ink.

A visual inspection of the ink in a vertical test tube avoiding agitation shows instability by vertical sedimentation by showing a difference in optical absorption depending on the vertical position in the test tube A more quantitative and more preferred technique uses multiple light scattering coupled with vertical scanning to monitor the dispersion state of a product. Acceleration of the sedimentation phenomena can be used for example by fast centrifugation during test. A commercial available apparatus is for example a Lumisizer® from LUM GmbH. The samples were measured during 24 hours at 3000 rpm with 880 nm radiation. A stability index provided by the Lumisizer® ranges between 0 and 1, wherein the instability increases from 0 to 1.

Example 1

Preparation of the Silver Nanoparticle Dispersion NPD-01

20.0 g of silver oxide (from Umicore) was added while stirring to a mixture of 40.0 g of ethanol and 23.0 g of 2-pyrrolidone. The pre-dispersion was then stirred for 24 hours.

Then, 2.67 ml of formic acid was added (1.25 ml/min) to the pre-dispersion while stirring and keeping the temperature at room temperature. After the addition of the formic acid, the mixture was further stirred for 2.5 hours at 23-25° C.

Then, the mixture was filtered using a 60 μm filter cloth. The filtrate was then concentrated at 40° C., first for 60 min at 110 mbar, then for 30 min at 60 mbar to obtain a silver nanoparticle dispersion containing ±45 wt % of silver.

Preparation of the Silver Nanoparticle Dispersion NPD-02 and NPD-03

NPD-02 and NPD-03 were prepared as described for NPD-01 above. However, before adding the formic acid, respectively 0.09 g (NPD-02) and 0.18 g of DSC-02 was added to the 24 hours stirred pre-dispersion.

The wt % of DSC-02 relative to the total amount of silver (wt % DSC/Ag) was respectively 0.45 and 0.90%.

Preparation of the Silver Ink AgInk-01 to AgInk-03

The silver inks AgInk-01 to AgInk-03 were prepared by mixing 50 wt % of respectively NPD-01 to NPD-03 with 25 wt % 2-fenoxy-ethanol and 25 wt % gamma-butyro-lactone.

The silver inks AgInk-04 and 05 were prepared by mixing 50 wt % NPD-01 with 25 wt % 2-fenoxy-ethanol, 25 wt % gamma-butyro-lactone and an amount of DSC-02 to obtain a wt % of DSC-02 relative to the total weight of silver of respectively 0.45 and 0.90%.

Preparation of the Conductive Silver Coatings SC-01 to SC-05

The silver inks AgInk-01 to AgInk-05 were then coated on a polyester support (blade coater, coating thickness was 10 μm) and cured for 30 minutes at 150° C.

The conductivity of the coated layers was measured as described above. The results are shown in Table 1.

TABLE 1

| SC | Silver Ink | [Ag] wt % | DSC | wt % DSC/Ag | SER | % Ag bulk |
|---|---|---|---|---|---|---|
| SC-01 | AgInk-01 (COMP) | 22.4 | — | — | 0.501 | 8.9 |
| SC-02 | AgInk-02 (INV) | 22.4 | DSC-02 | 0.45 | 0.165 | 18.9 |
| SC-03 | AgInk-03 (INV) | 22.4 | DSC-02 | 0.90 | 0.185 | 22.9 |
| SC-04 | AgInk-04 (INV) | 22.4 | DSC-02 | 0.45 | 0.147 | 17.9 |
| SC-05 | AgInk-05 (INV) | 22.4 | DSC-02 | 0.90 | 0.197 | 15.0 |

From the results of Table 1 it is clear that the addition of the dispersion-stabilizing compound DSC-02 to a silver ink results in a higher conductivity of coating obtained therefrom. The dispersion-stabilizing compound can be added during the synthesis of the silver particles (AgInk-02 and 03) or afterwards during the preparation of the inkjet ink (AgInk-04 and 05).

Example 2

Preparation of the Silver Nanoparticle Dispersion NPD-04

NPD-04 was prepared as NPD-01 described above.

Preparation of the Silver Nanoparticle Dispersion NPD-05 and NPD-06

NPD-05 and NPD-06 were prepared as described for NPD-01 above. However, before adding the formic acid, respectively 0.10 g (NPD-05) and 0.20 g of DSC-02 (NPD-06) was added to the 24 hours stirred pre-dispersion.

The wt % of DSC-02 relative to the total amount of silver (wt % DSC/Ag) was respectively 0.54 and 1.10%.

Preparation of the Silver Ink AgInk-06 to AgInk-08

The silver inks AgInk-06 to AgInk-08 were prepared by mixing 50 wt % of respectively NPD-04 to NPD-06 with 25 wt % 2-fenoxy-ethanol and 25 wt % gamma-butyro-lactone.

Preparation of the Conductive Silver Coatings SC-06 to SC-08

The silver inks AgInk-06 to AgInk-08 were then coated on a polyester support (blade coater, coating thickness was 10 μm) and cured for 30 minutes at 150° C.

The conductivity of the coated layers was measured as described above. The results are shown in Table 2.

The stability of the silver inks was measured as described above and expressed as Lumisizer instability index. The results are shown in Table 2.

TABLE 2

| SC | Silver Ink | [Ag] wt % | DSC | wt % DSC/Ag | SER | % Ag bulk | Stability |
|---|---|---|---|---|---|---|---|
| SC-06 | AgInk-06 (COMP) | 22.4 | — | — | 1.824 | 2.0 | 0.34 |
| SC-07 | AgInk-07 (INV) | 22.4 | DSC-02 | 0.54 | 0.128 | 21.9 | <0.01 |
| SC-08 | AgInk-08 (INV) | 22.4 | DSC-02 | 1.10 | 0.197 | 21.6 | <0.01 |

From the results of Table 2 it is clear that the addition of the dispersion-stabilizing compound DSC-02 to a silver ink results in a higher conductivity of coating obtained therefrom. It is also clear that the addition of the dispersion-stabilizing compound DSC-02 results in more stable inkjet silver inks.

Example 3

Preparation of the Silver Nanoparticle Dispersion NPD-07

NPD-07 was prepared as NPD-01 described above.

Preparation of the Silver Nanoparticle Dispersion NPD-08 and NPD-17

NPD-08 to NPD-17 were prepared as described for NPD-01 above. However, before adding the formic acid a dispersion-stabilizing compound in an amount as shown in Table 3 (expressed as wt % DSC relative to total amount of silver, wt % DSC/Ag) was added to the 24 hours stirred pre-dispersion.

Preparation of the Silver Ink AgInk-09 to AgInk-19

The silver inks AgInk-09 to AgInk-19 were prepared by mixing 50 wt % of respectively NPD-07 to NPD-17 with 25 wt % 2-fenoxy-ethanol, 25 wt % gamma-butyro-lactone and 0.04 wt % of a 5.0 wt % solution of vinylphosphonic acid in 2-pyrrolidone.

Preparation of the Conductive Silver Coatings SC-09 to SC-30

The conductive silver coatings SC-09 to SC-19 were obtained by coating the silver inks AgInk-09 to AgInk-19 on a polyester support (blade coater, coating thickness was 10 μm) and cured for 30 minutes at 150° C. The conductive silver coatings SC-20 to SC-30 were obtained by coating the silver inks AgInk-09 to AgInk-19 on a polyester support (blade coater, coating thickness was 10 μm) provided with a primer having a composition as shown in Table 3 and cured for 30 minutes at 150° C. (The conductive silver coatings are provided on the primer).

TABLE 3

| Ingredients | (mg/m$^2$) |
|---|---|
| Copol (ViCl$_2$-MA-IA) | 151.00 |
| Kieselsol 100F | 35.00 |
| Mersolat H40 | 0.75 |

The conductivities of the coated layers were measured as described above. The results are shown in Table 4.

The stability of the silver inks was measured as described above by visual inspection to reach at least 5% sedimentation in a vertical not agitated test tube. The results are shown in Table 4.

TABLE 4

| SC | Silver Ink | [Ag] wt % | DSC | wt % DSC/Ag | SER | % Ag bulk | Stability |
|---|---|---|---|---|---|---|---|
| SC-09 | AgInk-09 (COMP) | 22.4 | — | — | 0.235 | 20.2 | <1 day |
| SC-10 | AgInk-10 (INV) | 22.4 | DSC-02 | 0.60 | 0.219 | 19.5 | >3 weeks |
| SC-11 | AgInk-11 (INV) | 22.4 | DSC-04 | 0.08 | 0.305 | 15.2 | 2 days |
| SC-12 | AgInk-12 (INV) | 22.4 | DSC-04 | 0.60 | 1.307 | 4.0 | 2 days |
| SC-13 | AgInk-13 (INV) | 22.4 | DSC-01 | 0.08 | 0.232 | 18.4 | >3 weeks |
| SC-14 | AgInk-14 (INV) | 22.4 | DSC-01 | 0.60 | 0.348 | 15.0 | >3 weeks |
| SC-15 | AgInk-15 (INV) | 22.4 | DSC-05 | 0.08 | 0.218 | 18.7 | 2 days |
| SC-16 | AgInk-16 (INV) | 22.4 | DSC-05 | 0.60 | 0.969 | 5.9 | 2 days |
| SC-17 | AgInk-17 (INV) | 22.4 | DSC-03 | 0.01 | 0.231 | 16.4 | >3 weeks |
| SC-18 | AgInk-18 (INV) | 22.4 | DSC-03 | 0.08 | 0.329 | 13.4 | >3 weeks |
| SC-19 | AgInk-19 (INV) | 22.4 | DSC-03 | 0.60 | 1.255 | 3.3 | >3 weeks |
| SC-20 | AgInk-09 (COMP) | 22.4 | — | — | 0.288 | 14.1 | <1 day |
| SC-21 | AgInk-10 (INV) | 22.4 | DSC-02 | 0.60 | 0.191 | 28.2 | >3 weeks |
| SC-22 | AgInk-11 (INV) | 22.4 | DSC-04 | 0.08 | 0.293 | 14.2 | 2 days |
| SC-23 | AgInk-12 (INV) | 22.4 | DSC-04 | 0.60 | 0.444 | 11.0 | 2 days |
| SC-24 | AgInk-13 (INV) | 22.4 | DSC-01 | 0.08 | 0.254 | 17.3 | >3 weeks |
| SC-25 | AgInk-14 (INV) | 22.4 | DSC-01 | 0.60 | 0.258 | 24.0 | >3 weeks |
| SC-26 | AgInk-15 (INV) | 22.4 | DSC-05 | 0.08 | 0.253 | 15.7 | 2 days |
| SC-27 | AgInk-16 (INV) | 22.4 | DSC-05 | 0.60 | 0.366 | 13.0 | 2 days |
| SC-28 | AgInk-17 (INV) | 22.4 | DSC-03 | 0.01 | 0.287 | 15.7 | >3 weeks |
| SC-29 | AgInk-18 (INV) | 22.4 | DSC-03 | 0.08 | 0.221 | 18.4 | >3 weeks |
| SC-30 | AgInk-19 (INV) | 22.4 | DSC-03 | 0.60 | 0.464 | 9.0 | >3 weeks |

From the results of Table 4 it is clear that the addition of the dispersion-stabilizing compounds results in more stable inkjet silver inks. It is also clear from the results that the conductivity of the silver coatings may decrease at higher amounts of the dispersion-stabilizing compounds.

The results in Table 4 also show that the silver coatings applied on the primer having a composition of Table 3 have a higher conductivity (lower SER) compared to those applied on the unsubbed support. This may be due to the release of an acid, i.e. HCl, from the primer during curing.

Example 4

Preparation of the Silver Nanoparticle Dispersion NPD-18 to NPD-25

The silver nanoparticle dispersions NPD-18 to NPD-25 were prepared as described for NPD-01 and NPD-02 using the amounts of 2-pyrrolidone, ethanol, silveroxide, formic acid and DSC-01 of Table 5.

TABLE 5

| Ingredients | NPD-18 | NPD-19 | NPD-20 | NPD-21 | NPD-22 | NPD-23 |
|---|---|---|---|---|---|---|
| 2-pyrrolidone (g) | 43.6 | 43.6 | 79.3 | 79.3 | 115.0 | 115.0 |
| Ethanol (g) | 450.0 | 450.0 | 450.0 | 450.0 | 450.0 | 450.0 |
| Silveroxide (g) | 37.9 | 37.9 | 69.0 | 69.0 | 100.0 | 100.0 |
| DSC-01 (g) | — | 0.24 | — | 0.43 | — | 0.62 |
| formic acid (g) | 6.2 | 6.2 | 11.2 | 11.2 | 16.3 | 16.3 |
| Silver (wt %) | 44.7 | 44.6 | 44.7 | 44.6 | 44.7 | 44.6 |

TABLE 5-continued

| | NPD-24 | NPD-25 |
|---|---|---|
| 2-pyrrolidone (g) | 258.8 | 258.8 |
| Ethanol (g) | 450.0 | 450.0 |
| Silveroxide (g) | 225.0 | 225.0 |
| wt % DSC-01/Ag | — | 1.39 |
| formic acid | 36.6 | 36.6 |
| Silver (wt %) | 44.7 | 44.6 |

Preparation of the Silver Ink AgInk-20 to AgInk-27

The silver inks AgInk-20 to AgInk-27 were prepared by mixing 50 wt % of respectively NPD-18 to NPD-25 with 32 wt % 2-fenoxy-ethanol and 32 wt % gamma-butyro-lactone.

Preparation of the Conductive Silver Coatings SC-31 to SC-44

The conductive silver coatings SC-31 to SC-44 were obtained by coating the silver inks AgInk-20 to AgInk-27 on the subbed polyester support described above (blade coater, coating thickness was 10 μm) and cured as shown in Table 6.

TABLE 6

| SC | Silver Ink | [Ag] wt % | DSC | wt % DSC/Ag | Curing° C. | Curing (min) | SER | % Ag bulk |
|---|---|---|---|---|---|---|---|---|
| SC-31 | AgInk-20 (COMP) | 20.0 | — | — | 150 | 15 | 25.284 | 0.3 |
| SC-32 | AgInk-20 (COMP) | 20.0 | — | — | 150 | 30 | 15.956 | 0.4 |
| SC-33 | AgInk-21 (INV) | 20.0 | DSC-01 | 0.30 | 150 | 15 | 0.572 | 12.3 |
| SC-34 | AgInk-21 (INV) | 20.0 | DSC-01 | 0.30 | 150 | 30 | 0.648 | 10.9 |
| SC-35 | AgInk-22 (COMP) | 20.0 | — | — | 150 | 15 | 3.927 | 1.5 |
| SC-36 | AgInk-22 (COMP) | 20.0 | — | — | 150 | 30 | 4.443 | 1.3 |
| SC-37 | AgInk-23 (INV) | 20.0 | DSC-01 | 0.30 | 150 | 15 | 0.489 | 11.9 |
| SC-38 | AgInk-23 (INV) | 20.0 | DSC-01 | 0.30 | 150 | 30 | 0.430 | 13.5 |
| SC-39 | AgInk-24 (COMP) | 20.0 | — | — | 150 | 15 | 1.181 | 4.0 |
| SC-40 | AgInk-24 (COMP) | 20.0 | — | — | 150 | 30 | 1.089 | 4.3 |
| SC-41 | AgInk-25 (INV) | 20.0 | DSC-01 | 0.30 | 150 | 15 | 0.676 | 7.4 |
| SC-42 | AgInk-25 (INV) | 20.0 | DSC-01 | 0.30 | 150 | 30 | 0.513 | 9.8 |

TABLE 6-continued

| SC | Silver Ink | [Ag] wt % | DSC | wt % DSC/Ag | Curing° C. | Curing (min) | SER | % Ag bulk |
|---|---|---|---|---|---|---|---|---|
| SC-43 | AgInk-26 (COMP) | 20.0 | — | — | 150 | 30 | 0.743 | 7.2 |
| SC-44 | AgInk-27 (INV) | 20.0 | DSC-01 | 0.30 | 150 | 30 | 0.791 | 7.4 |

From the results of table 6 it is clear that the presence of the dispersion-stabilizing compound results in a higher conductivity of the silver coatings. The results also illustrate that a curing time of 15 seconds at a curing temperature of 150° C. already results in high conductivities of the silver coatings.

It is also clear from the results of Table 6 that it is not the absolute amount of the dispersion-stabilizing compound used in the preparation of the silver nanoparticles but rather the amount relative to the amount of silver, expressed as wt % DSC relative to the total amount of silver, which determines the final properties of the silver inks.

Example 5

Preparation of the Silver Nanoparticle Dispersion NPD-26

100.0 g of silver oxide (from Umicore) was added while stirring to a mixture of 450.0 g of ethanol and 115.0 g of 2-pyrrolidone. The pre-dispersion was then stirred at 23° C. for 8 hours.

Then, 0.62 g of DSC-01 was added to the pre-dispersion followed by the addition of 16.3 g of formic acid (10.0 ml/min) while stirring and keeping the temperature at 23° C. After the addition of the formic acid, the mixture was further stirred for 2.5 hours at 23° C.

The dispersion was then concentrated to approximately 208.7 g by evaporation of the organic solvent to obtain a silver nanoparticle dispersion containing ±44.6 wt % of silver.

To 25.0 g of the concentrated dispersion, 1.5 g of a 50/50 wt % mixture of 2-fenoxy-ethanol/proylene carbonate and 75.0 g of water was added.

After approximately 1 hour, sedimentation of the silver particles started.

After 24 hours, the supernatant was decanted and the sediment filtrated over a 4-7 μm paper.

The filtrate was then further dried at 35° C. to remove the water to obtain a silver sediment paste with a silver content of more than 90 wt %.

Preparation of the Silver Ink AgInk-28 to AgInk-35

The silver inks AgInk-28 to AgInk-35 were prepared by mixing 22.3 wt % of the silver sediment paste with 77.0 wt % of the solvents shown in Table 7.

TABLE 7

| Silver ink | Liquid Carrier | Stability of the ink(*) |
|---|---|---|
| AgInk-28 | 2-fenoxyethanol/gamma-butyrolacton | 0.5 |
| AgInk-29 | 2-fenoxyethanol/2-pyrrolidone | 4.5 |
| AgInk-30 | Propylene carbonate | 1.0 |
| AgInk-31 | Propylene carbonate/2-pyrrolidone | 3.0 |
| AgInk-32 | n-butanol | 0.5 |
| AgInk-33 | Gamma-butyrolacton/2-pyrrolidone | 4.0 |
| AgInk-34 | 1-methoxy-2-propanol | 0.5 |
| AgInk-35 | 2-butoxyethanol | 0.5 |

(*)visual inspection, 0 is stable, 5 is unstable.

It's clear from Table 7 that the presence 2-pyrrolidone in combination with other solvents may results in unstable silver inks. When 2-pyrrolidone is used to prepare the silver nanoparticles, it is advantageous to remove 2-pyrrolidone by carrying out a washing step, preferable with water, and to use other liquid carriers to formulate the silver inkjet ink.

It is clear from table 7 the liquid carriers used, all result in stable silver inkjet inks.

Example 6

Preparation of the Silver Ink AgInk-36 to AgInk-41

37.9 g of silver oxide (from Umicore) was added while stirring to a mixture of 329.1 g of ethanol and 164.5 g of 2-pyrrolidone. The pre-dispersion was then stirred at 23° C. for 8 hours.

Then, 0.24 g of DSC-01 was added to the pre-dispersion followed by the addition of 6.2 g of formic acid (10.0 ml/min) while stirring and keeping the temperature at 23° C. After the addition of the formic acid, the mixture was further stirred for 2.5 hours at 23° C.

The dispersion was then concentrated to approximately 79.2 g by evaporation of the organic solvent to obtain a silver nanoparticle dispersion containing ±44.6 wt % of silver.

75.0 g of water was added to 25.0 g of the concentrated dispersion to induce sedimentation of the silver particles.

After 24 hours, the supernatant was decanted. After addition of water (75.0 g), the sediment was stirred and filtrated over 4-7 μm paper to remove excess supernatant.

Ethanol and a mixture of high boiling solvents shown Table 8 (HBS wash) were added to the sediment(1 part sediment/1 part high boiling solvent/2 parts ethanol). The sediment was then further dried at 40° C. to remove water and ethanol to obtain a silver nanoparticle dispersion with a silver content of approximately 40 wt %.

The silver inks AgInk-36 to AgInk-41 were then prepared by mixing 50.0 wt % of the silver nanoparticle dispersion, 47.5 wt % of high boiling solvents (HBS ink) shown in Table 8 and 2.5 wt % of propylenecarbonate, the latter to decrease the viscosity. All silver inks AgInk-36 to AgInk-47 were stable.

TABLE 8

|  | HBS (wash) | HBS (ink) | SER | % Ag bulk |
|---|---|---|---|---|
| AgInk-36 | 2-fenoxyethanol/1,2 propanediol (2/1) | 2-fenoxyethanol/propylenecarbonate | 0.25 | 16.2 |
| AgInk-37 | 2-fenoxyethanol/1,2 propanediol (2/1) | Diaceton alcohol/propylenecarbonate | 0.31 | 14.4 |
| AgInk-38 | 2-fenoxyethanol/Propylenecarbonate (3/1) | 2-fenoxyethanol/propylenecarbonate | 0.41 | 12.5 |
| AgInk-39 | 2-fenoxyethanol/Propylenecarbonate (3/1) | Diaceton alcohol/propylenecarbonate | 0.65 | 8.1 |
| AgInk-40 | 2-fenoxyethanol/Diaceton alcohol (2/1) | 2-fenoxyethanol/propylenecarbonate | 0.14 | 26.1 |
| AgInk-41 | 2-fenoxyethanol/Diaceton alcohol (2/1) | Diaceton alcohol/propylenecarbonate | 0.24 | 14.5 |

The silver inks AgInk-36 to AgInk-41 were then coated on the subbed polyester support described above (blade coater, coating thickness was 10 μm) and cured at 150° C. for 15 minutes. The conductivities of the coated layers were measured as described above. The results are shown in Table 8.

From the results in Table 8 it is clear that all coatings from the silver inks AgInk-36 to AgInk-41 had a good conductivity.

Example 7

Preparation of the Silver Ink AgInk-42 to AgInk-44

113.7 g of silver oxide (from Umicore) was added while stirring to a mixture of 1083.8 g of ethanol and 397.0 g of 2-pyrrolidone. The pre-dispersion was then stirred at 23° C. for 8 hours.

Then, 18.6 g of formic acid (10.0 ml/min) was added while stirring and keeping the temperature at 23° C. After the addition of the formic acid, the mixture was further stirred for 2.5 hours at 23° C.

The dispersion was then concentrated to approximately 238.6 g by evaporation of the organic solvent to obtain a concentrated silver nanoparticle dispersion.

75.0 g of water was added to 25.0 g of the concentrated silver nanoparticle dispersion to induce sedimentation of the silver particles.

After 24 hours, the supernatant was decanted. After addition of water (75.0 g), the sediment was stirred, first filtered over a 17 μm filter and then filtered over 4-7 μm paper to remove excess supernatant.

Ethanol, 2-fenoxyethanol and DSC-01 in an amount as shown Table 9 (expressed as wt % relative to the total amount of silver) were added to the silver sediment (1 part sediment/1 part 2-fenoxyethanol/2 parts ethanol). The silver sediment was then further dried at 40° C. to remove water and ethanol to obtain a silver nanoparticle dispersion with a silver content of approximately 40 wt %.

The silver inks AgInk-42 to AgInk-44 were then prepared by mixing 50.0 wt % of the silver nanoparticle dispersion, 47.5 wt % of 2-fenoxyethanol and 2.5 wt % of propylenecarbonate.

The silver inks AgInk-42 to AgInk-44 were then coated on the subbed polyester support described above (blade coater, coating thickness was 10 μm) and cured at 150° C. for 15 minutes. The conductivities of the coated layers were measured as described above. The results are shown in Table 9.

TABLE 9

|  | wt % DSC-01/Ag | Stability ink (*) | SER | % Ag bulk |
|---|---|---|---|---|
| AgInk-42 | 0.10 | 4.5 | 13.164 | 8.1 |
| AgInk-43 | 0.20 | 1.5 | 3.312 | 26.1 |
| AgInk-44 | 0.30 | 0.5 | 1.092 | 14.1 |

(*) visual inspection, 0 is stable, 5 is unstable.

It is clear from the results of Table 9 that an increasing amount of DSC-01 results in more stable silver inks.

Example 8

Preparation of the Silver Inks AgInk-45 to AgInk-53

450 g of silver oxide (from Umicore) was added while stirring to a mixture of 875 g of ethanol, and 517 g of 2-pyrrolidone. The predispersion was then stirred at 23° C. for 15 hours.

Then, 2.8 g of DSC-01 was added to the mixture followed by the addition of 73 g of formic acid (10.0 mL/min) while stirring and keeping the temperature at 23° C. After the addition of the formic acid, the mixture was further stirred for 15 hours at 23° C.

The dispersion was then concentrated by evaporation of the organic solvent to obtain a concentrated silver nanoparticle dispersion with a silver content of approximately 45 wt %.

The silver inks AgInk-45 to AgInk-53 were then prepared by mixing 44 wt % of the silver nanoparticle dispersion and the respective quantities of 2-fenoxyethanol, propylenecarbonate and n-butanol shown in Table 10.

The stability of the silver inks AgInk-45 to AgInk-53 was measured as described above and expressed as Lumisizer instability index. The results are shown in Table 10. Based on the instability index, the inks AgInk-45 to AgInk-47 were selected as the most stable ones and employed for determining the highest jetting frequency at which a stable jetting is achieved. The jetting tests were performed by using a Dimatix materials printer (DMP-2831) and disposable cartridges (DMC-11610) with a nominal droplet volume of 10 pL. The results are shown in Table 10. Furthermore, several patterns were inkjet printed on the subbed polyester support described above and cured at 150° C. for 30 minutes. The conductivities of the printed patterns were measured as described above. The results are shown in Table 10.

TABLE 10

|  | wt % Ag nanoparticle dispersion | wt % 2-Fenoxy ethanol | wt % Propylene carbonate | wt % n-butanol | Stability | Max. Jetting frequency (kHz) | SER |
|---|---|---|---|---|---|---|---|
| AgInk-45 | 44 | 50 | 6 | 0 | 0.028 | 2 | 0.114 |
| AgInk-46 | 44 | 40 | 6 | 10 | 0.041 | 5 | 0.086 |
| AgInk-47 | 44 | 30 | 6 | 20 | 0.089 | 5 | 0.118 |

TABLE 10-continued

| | wt % Ag nanoparticle dispersion | wt % 2-Fenoxy ethanol | wt % Propylene carbonate | wt % n-butanol | Stability | Max. Jetting frequency (kHz) | SER |
|---|---|---|---|---|---|---|---|
| AgInk-48 | 44 | 20 | 6 | 30 | 0.112 | — | — |
| AgInk-49 | 44 | 10 | 6 | 40 | 0.532 | — | — |
| AgInk-50 | 44 | 40 | 0 | 16 | 0.117 | — | — |
| AgInk-51 | 44 | 30 | 0 | 26 | 0.158 | — | — |
| AgInk-52 | 44 | 40 | 3 | 13 | 0.276 | — | — |
| AgInk-53 | 44 | 30 | 3 | 23 | 0.373 | — | — |

It is clear from the results of Table 10 that stable silver inks can be obtained by optimizing the solvent composition. Additionally, it is clear from the results of Table 10 that the addition of n-butanol results on stable silver inks with higher maximum jetting frequencies without affecting the conductivities of the printed patterns.

The invention claimed is:

1. A metallic nanoparticle dispersion comprising:
   metallic nanoparticles;
   a liquid carrier; and
   a non-polymeric dispersion-stabilizing compound according to Formula I, II, III, or IV:

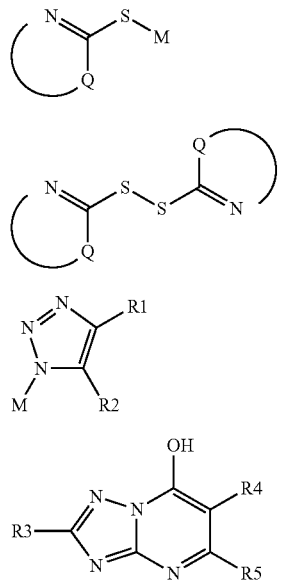

Formula I

Formula II

Formula III

Formula IV

Q represents atoms necessary to form a substituted or unsubstituted five or six membered heteroaromatic ring;
M is selected from the group consisting of a proton, a monovalent cationic group, and an acyl group;
R1 and R2 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thioether, an ether, an ester, an amide, an amine, a halogen, a ketone, and an aldehyde;
R1 and R2 may represent necessary atoms to form a five to seven membered ring;
R3 to R5 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thiol, a thioether, a sulfone, a sulfoxide, an ether, an ester, an amide, an amine, a halogen, a ketone, an aldehyde, a nitrile, and a nitro group; and
R4 and R5 may represent necessary atoms to form a five to seven membered ring.

2. The metallic nanoparticle dispersion according to claim 1, wherein the non-polymeric dispersion-stabilizing compound is Formula I and Q represents atoms necessary to form a five membered heteroaromatic ring.

3. The metallic nanoparticle dispersion according to claim 2, wherein the five membered heteroaromatic ring is selected from the group consisting of an imidazole, a benzimidazole, a thiazole, a benzothiazole, an oxazole, a benzoxazole, a 1,2,3-triazole, a 1,2,4-triazole, an oxadiazole, a thiadiazole, and a tetrazole.

4. The metallic nanoparticle dispersion according to claim 1, wherein the non-polymeric dispersion-stabilizing compound is selected from the group consisting of N,N-dibutyl-(2,5-dihydro-5-thioxo-1H-tetrazol-1-yl-acetamide, 5-heptyl-2-mercapto-1,3,4-oxadiazole, 1-phenyl-5-mercaptotetrazol, 5-methyl-1,2,4-triazolo-(1,5-a) primidine-7-ol, and S[5-[(ethoxy-carbonyl)amino]-1,3,4-thiadiazol-2-yl] O-ethyl thiocarbonate.

5. The metallic nanoparticle dispersion according to claim 1, wherein an amount of the non-polymeric dispersion-stabilizing compound expressed as wt % relative to a total weight of silver in the metallic nanoparticle dispersion is between 0.005 and 10.0.

6. The metallic nanoparticle dispersion according to claim 1, wherein the liquid carrier is a high boiling solvent.

7. The metallic nanoparticle dispersion according to claim 6, wherein the high boiling solvent is selected from the group consisting of 2-fenoxy ethanol, 4-methyl-1,3-dioxolan-2-one, n-butanol, 1,2 propanediol, 4-hydroxy-4-methyl pentan-2-one, pentan-3-one, 2-butoxy-ethanol, 1-methoxy-2-propanol, and mixtures thereof.

8. The metallic nanoparticle dispersion according to claim 1, wherein a viscosity of the metallic nanoparticle dispersion is between 2 and 100 mPa·s at 25° C. at a shear rate of 90 s$^{-1}$.

9. The metallic nanoparticle dispersion according to claim 1, wherein the metallic nanoparticle dispersion is a conductive inkjet ink or a conductive flexographic ink.

10. A method for preparing metallic nanoparticles comprising:
dispersing metallic or metallic precursor particles in a dispersion medium including a solvent according to Formula V:

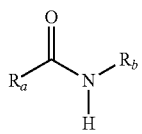

Formula V wherein Ra and Rb represent an optionally substituted alkyl group, and Ra and Rb may form a ring;
washing the metallic or metallic precursor particles with a washing liquid including water to substantially remove the solvent according to Formula V;
evaporating the metallic or metallic precursor particles to substantially remove the water thereby producing the metallic nanoparticle dispersion according to claim 1;
wherein
the step of evaporating is carried out in the presence of a high boiling solvent and a non-polymeric dispersion-stabilizing compound according to Formula I, II, III, or IV:

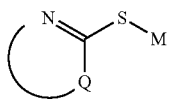

Formula I

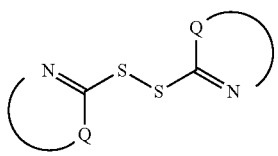

Formula II

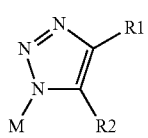

Formula III

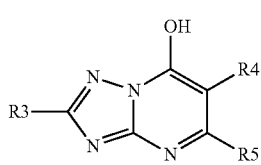

Formula IV wherein
Q represents atoms necessary to form a substituted or unsubstituted five or six membered heteroaromatic ring;
M is selected from the group consisting of a proton, a monovalent cationic group, and an acyl group;
R1 and R2 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thioether, an ether, an ester, an amide, an amine, a halogen, a ketone, and an aldehyde;
R1 and R2 may represent necessary atoms to form a five to seven membered ring;
R3 to R5 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thiol, a thioether, a sulfone, a sulfoxide, an ether, an ester, an amide, an amine, a halogen, a ketone, an aldehyde, a nitrile, and a nitro group; and
R4 and R5 may represent necessary atoms to form a five to seven membered ring.

11. The method according to claim 10, wherein the dispersion medium includes a solvent selected from 2-pyrrolidone, 4-hydroxy-2-pyrrolidone, 6-valerolactam, or ε-caprolactam.

12. The method according to claim 10, wherein the high boiling solvent is selected from the group consisting of 2-fenoxy ethanol, 4-methyl-1,3-dioxolan-2-one, n-butanol, 1,2 propanediol, 4-hydroxy-4-methyl pentan-2-one, pentan-3-one, 2-butoxyethanol, 1-methoxy-2-propanol, and mixtures thereof.

13. The method according to claim 10, wherein the step of dispersing includes an in-situ reduction while mixing a metal precursor selected from a metal oxide, a metal hydroxide, a metal salt, or a combination thereof with a reductant.

14. The method according to claim 13, wherein the step of dispersing includes an in-situ reduction of silver oxide with a reductant.

15. A method of preparing a metallic layer or pattern comprising:
applying a metallic nanoparticle dispersion as defined in claim 1 on a substrate; and
sintering the metallic nanoparticle dispersion applied on the substrate.

* * * * *